United States Patent [19]

Walls et al.

[11] Patent Number: 5,219,699
[45] Date of Patent: Jun. 15, 1993

[54] PHOTOSENSITIVE COMPOSITIONS AND LITHOGRAPHIC PRINTING PLATES CONTAINING ACID-SUBSTITUTED TERNARY ACETAL POLYMERS

[75] Inventors: John E. Walls; Larry D. LeBoeuf, both of Fort Collins, Colo.

[73] Assignee: Eastman Kodak Company, Rochester, N.Y.

[21] Appl. No.: 738,088

[22] Filed: Jul. 30, 1991

[51] Int. Cl.$^5$ .................. G03F 7/021; G03F 7/32; G03C 1/77
[52] U.S. Cl. .................. 430/156; 430/157; 430/175; 430/176; 430/278; 430/302; 430/325; 430/909; 525/61
[58] Field of Search .............. 430/175, 278, 302, 909, 430/325, 157, 176, 162, 156; 525/61

[56] References Cited

U.S. PATENT DOCUMENTS

| | | | |
|---|---|---|---|
| 4,413,091 | 11/1983 | Iwasaki et al. | 525/61 |
| 4,588,669 | 5/1986 | Asano | 430/156 |
| 4,652,604 | 3/1987 | Walls et al. | 522/63 |
| 4,707,437 | 11/1987 | Walls et al. | 430/175 |
| 4,741,985 | 5/1988 | Aoai et al. | 430/175 |
| 4,940,646 | 7/1990 | Pawlowski | 430/175 |

*Primary Examiner*—Charles L. Bowers, Jr.
*Assistant Examiner*—John S. Chu
*Attorney, Agent, or Firm*—Alfred P. Lorenzo

[57] ABSTRACT

Photosensitive compositions, useful in lithographic printing plates which can be developed with aqueous developing solutions, comprise a diazo resin and an acid-substituted ternary acetal polymer which functions as a polymeric binder. The acid-substituted ternary acetal polymers are comprised of recurring units which include three six-membered cyclic acetal groups, one of which is unsubstituted or substituted with an alkyl or hydroxyalkyl group, another of which is substituted with an aromatic or heterocyclic moiety, and a third of which is substituted with an acid group, an acid-substituted alkyl group or an acid-substituted aryl group.

26 Claims, No Drawings

PHOTOSENSITIVE COMPOSITIONS AND LITHOGRAPHIC PRINTING PLATES CONTAINING ACID-SUBSTITUTED TERNARY ACETAL POLYMERS

CROSS-REFERENCE TO RELATED APPLICATIONS

The novel acid-substituted ternary acetal polymers utilized in the photosensitive compositions and lithographic printing plates of this invention are disclosed and claimed in copending commonly assigned U.S. patent application Ser. No. 738,090 filed Jul. 30, 1991, "Acid-Substituted Ternary Acetal Polymers Useful In Photosensitive Compositions And Lithographic Printing Plates", by John E. Walls and Larry D. LeBoeuf.

FIELD OF THE INVENTION

This invention relates in general to novel photosensitive compositions and in particular to the use of such photosensitive compositions in lithographic printing plates. More specifically, this invention relates to photosensitive compositions comprising a diazo resin and an acid-substituted ternary acetal polymer and to lithographic printing plates comprising an imaging layer formed from such photosensitive compositions.

BACKGROUND OF THE INVENTION

It is well known to prepare photosensitive compositions comprising a photosensitive agent and a polymeric binder and to utilize such compositions in the preparation of lithographic printing plates which can be developed with aqueous neutral or alkaline developing solutions. In such compositions, it is common practice to utilize a diazo resin as the photosensitive agent. The lithographic printing plates typically comprise a metal substrate, such as a substrate of anodized aluminum, which is coated with a photo-sensitive composition comprising the diazo resin, the polymeric binder and other ingredients such as colorants, stabilizers, exposure indicators, surfactants, and the like.

Many different polymers have been proposed for use as binders in the aforesaid photosensitive compositions. Particular advantages have been achieved by the use of acetal polymers as described, for example, in U.S. Pat. Nos. 4,652,604, 4,741,985, and 4,940,646.

In U.S. Pat. No. 4,652,604, the acetal polymer contains acetal groups of three types, namely six-membered cyclic acetals, five-membered cyclic acetals and intermolecular acetals. In U.S. Pat. No. 4,741,985, the acetal polymer is a mono-acetal containing a six-membered cyclic acetal group. In U.S. Pat. No. 4,940,646, the acetal polymer contains vinyl acetal units derived from an aldehyde that contains hydroxyl groups.

Acetal polymers can be advantageously utilized in lithographic printing plates in which the layer containing the acetal polymer and the diazo resin is the sole radiation-sensitive layer. They can also be usefully employed in so-called "dual layer" plates. In this type of lithographic printing plate, a radiation-sensitive layer containing a diazo resin is coated over an anodized aluminum support and a radiation-sensitive layer containing a photocross-linkable polymer is coated over the layer containing the diazo resin. Such dual layer plates are described, for example, in British Patent No. 1 274 017. They are advantageous in that radiation-sensitive layers containing diazo resins adhere much more strongly to most anodized aluminum supports than do radiation-sensitive layers containing photocrosslinkable polymers. Thus, the enhanced performance provided by photocrosslinkable polymers is achieved without sacrificing the excellent adhesive properties of diazo resin compositions.

Copending commonly assigned U.S. patent application Ser. No. 738,068 filed Jul. 30, 1991, "Binary Acetal Polymers Useful In Photosensitive Compositions And Lithographic Printing Plates" by John E. Walls describes an important advance in the art relating to the use of acetal polymers in radiation-sensitive compositions and lithographic printing plates. The novel acetal polymers described in this patent application are binary acetal polymers exhibiting improved properties in comparison with previously known acetal polymers. They provide lithographic printing plates characterized by improved abrasion-resistance, improved resistance to chemical attack, extended press performance and enhanced rollup properties. The binary acetal polymers can be trimers, in which the recurring unit comprises a vinyl acetate moiety and first and second cyclic acetal groups, or tetramers in which the recurring unit comprises a vinyl alcohol moiety, a vinyl acetate moiety and first and second cyclic acetal groups. Both of the acetal groups are six-membered cyclic acetal groups, one of them is unsubstituted or substituted with an alkyl or hydroxyalkyl group and the other is substituted with an aromatic or heterocyclic moiety.

More specifically, the binary acetal polymers described in the aforesaid copending patent application are polymers with recurring units represented by the formula:

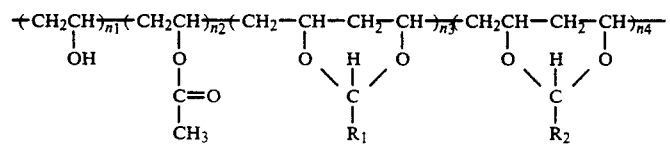

wherein $R_1$ is $-H$, $-C_nH_{2n+1}$ or $-C_2H_{2n}-OH$
where $n = 1-12$

R$_2$ is 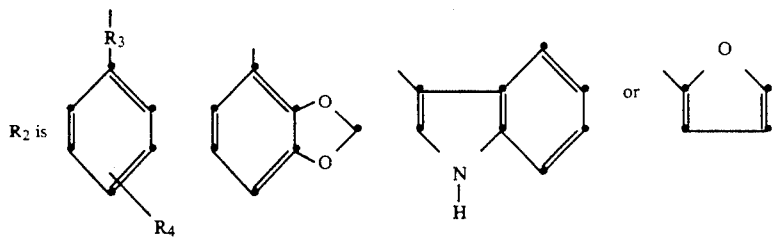

where R$_3$ is $-(CH_2)_x-$ or $-(CH_2)_m CH(CH_2)_p-$
                                        |
                                      $(CH_2)_y$
                                        |
                                      $CH_3$ and x = 0–8
m = 0–8
y = 0–8
p = 0–8

R$_4$ = —H, —R$_5$, 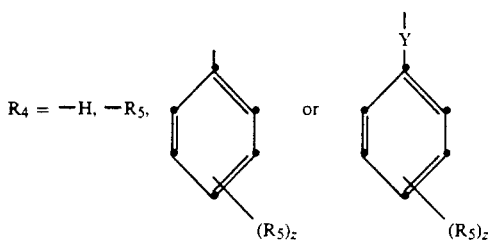

in which $$Y = -O-, -S-, -\overset{O}{\underset{O}{\overset{\|}{S}}}-, -CH_2-, -NH- \text{ or } CH_3\overset{|}{\underset{|}{C}}CH_3$$

R$_5$= —OH, —CH$_2$OH, —OCH$_3$, —COOH or —SO$_3$H
z = 1 to 3
and
$n_1$ = 0–25 mole %, preferably 5 to 15 mole %
$n_2$ = 2–25 mole %, preferably 5 to 15 mole %
$n_3$ = 10–60 mole %, preferably 15 to 35 mole %
$n_4$ = 35–80 mole %, preferably 45 to 70 mole %.

While the novel binary acetal polymers described above provide many important advantages, they have the disadvantage that they will not fully dissolve in aqueous developing solutions, but rather break-up in the form of particles which tend to re-deposit on the imaged areas of the printing plate. As a consequence of the particulate dissolution, there tends to be an undesirable build-up of residue in the processing equipment, such as on the brushes and/or the plush. A polymeric binder that dissolves fully in the developer solution affords better and surer cleanout of shadow screen areas, avoids coating residue build-up in the processing equipment, and minimizes the need to change filters.

It is toward the objective of providing improved photosensitive compositions and improved lithographic printing plates, capable of effectively meeting the needs of the lithographic printing plate art, that the present invention is directed.

SUMMARY OF THE INVENTION

In one embodiment, the present invention is directed to a photosensitive composition comprising a diazo resin and an acid-substituted ternary acetal polymer of the structure described herein. In a second embodiment, the invention is directed to a lithographic printing plate comprising an imaging layer formed from this photosensitive composition.

The acid-substituted ternary acetal polymers utilized in this invention, which are disclosed and claimed in the aforesaid copending U.S. patent application Ser. No. 738,090, have recurring units represented by the formula:

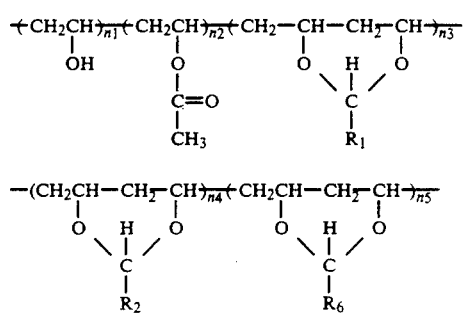

wherein R$_1$ is —H, —C$_n$H$_{2n+1}$ or —C$_2$H$_{2n}$—OH
where n = 1–12

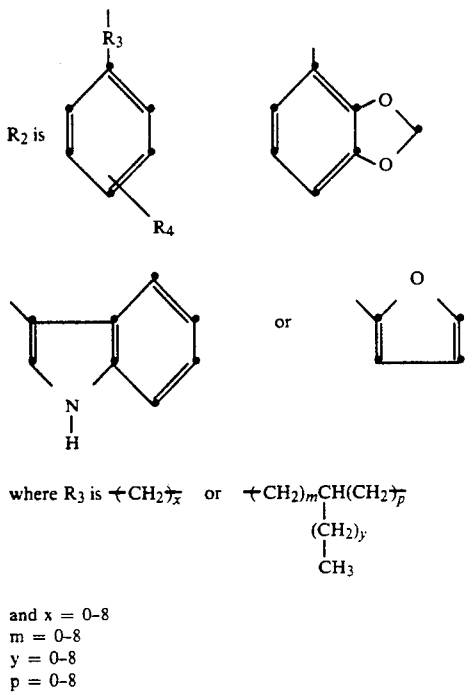

where $R_3$ is $-(CH_2)_x$ or $-(CH_2)_m CH(CH_2)_p$
                                          |
                                       $(CH_2)_y$
                                          |
                                        $CH_3$ and $x = 0-8$
$m = 0-8$
$y = 0-8$
$p = 0-8$

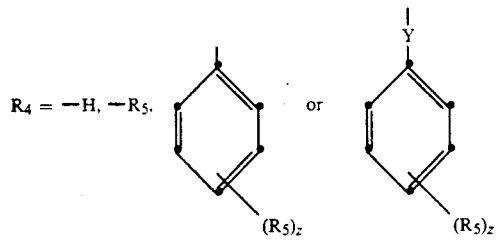

in which

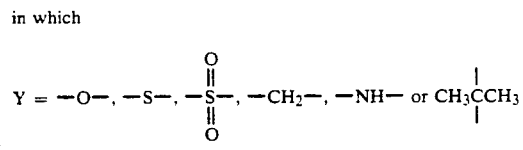

$R_5 = -OH, -CH_2OH, -OCH_3, -COOH$ or $-SO_3H$
$z = 1$ to $3$
$R_6 = -(CH_2)_a-COOH$
$-(CH_2)_a-COO^\ominus M^\oplus$ or

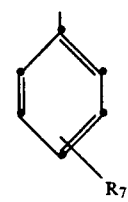

where $R_7 = -COOH, -COO^\ominus M^\oplus, -(CH_2)_a COOH,$
$-O-(CH_2)_a COOH, -SO_3H, -SO_3^\ominus M^\oplus, -PO_3H_2,$
$-PO_3^\ominus M_2^\oplus, -PO_4H_2$ or $-PO_4^\ominus M_2^\oplus,$
$a = 0$ to $8$
$M = Na, K, Li$ or $NH_4$ and $n_1 = 0-25$ mole %, preferably 3 to 15 mole %
$n_2 = 2-25$ mole %, preferably 5 to 15 mole %
$n_3 = 10-70$ mole %, preferably 15 to 50 mole %
$n_4 = 10-60$ mole %, preferably 12 to 45 mole %
$n_5 = 10-45$ mole %, preferably 15 to 30 mole %.

As indicated by the above structural formula, the acid-substituted ternary acetal polymers described herein can be tetramers, in which the recurring unit comprises a vinyl acetate moiety and first, second and third cyclic acetal groups, or pentamers in which the recurring unit comprises a vinyl alcohol moiety, a vinyl acetate moiety and first, second, and third cyclic acetal groups.

All three of the acetal groups are six-membered cyclic acetal groups, one of them is unsubstituted or substituted with an alkyl or hydroxyalkyl group, another is substituted with an aromatic or heterocyclic moiety, and a third is substituted with an acid group, an acid-substituted alkyl group or an acid-substituted aryl group.

The novel acid-substituted ternary acetal polymers described herein provide lithographic printing plates characterized by improved abrasion-resistance, improved resistance to chemical attack, extended press performance and enhanced rollup properties in comparison with the acetal polymers of the prior art. Lithographic printing plates utilizing the novel acid-substituted ternary acetal polymers described herein as polymeric binders also have the important advantage that they can be processed in aqueous alkaline developing solutions containing very low concentrations or organic solvents. This is highly advantageous in view of the high costs and environmental concerns associated with the use of organic solvents. Since the acid-substituted ternary acetal polymers are fully soluble in aqueous alkaline developing solutions, they avoid the problems encountered with binders that cause the coating to break-up in particulate form. Moreover, the excellent solubility properties of the acidsubstituted ternary acetal polymers permit the use of aqueous alkaline developing solutions with even lower concentrations of organic solvent than are required with the binary acetal polymers of the aforesaid copending patent application Ser. No. 738,068.

DESCRIPTION OF THE PREFERRED EMBODIMENTS

The novel acid-substituted ternary acetal polymers described herein can be prepared by hydrolyzing polyvinyl acetate, or by starting with partially hydrolyzed polyvinyl acetate, i.e. polyvinyl alcohol, and reacting it with three different aldehydes to thereby form a ternary acetal. Suitable techniques for forming polymers of this type are known to those skilled in the art. Thus, for example, the ternary acetal polymers can be prepared by an emulsion condensation wherein, as the solubility of the starting material changes from water-soluble to solvent-soluble as a result of the formation of the acetal groups, the product forms an emulsion because of its lack of solubility in water. In this method, the particles are prevented from aggregating by use of a surfactant. An alternative method is to compensate for the change in solubility of the starting material from water-soluble to solvent-soluble by maintaining a homogeneous solution through the continual addition of an appropriate solvent. In the former process, the precipitated particles are filtered, washed and dried. In the latter process, the reaction solution is added to water and mixed in a blender or homogenizer to precipitate the resin product and create particles of the desired size.

The acetalization is catalyzed by the use of an organic or inorganic acid in an amount that will effectively allow protonation to occur, but will not significantly alter the final product by causing unwanted hydrolysis of the acetal groups.

Examples of suitable aldehydes useful in preparing the first cyclic acetal group of the acid-substituted ternary acetal polymers described herein include:
formaldehyde
acetaldehyde
propionaldehyde
n-butyraldehyde
isobutyraldehyde
4-hydroxybutyraldehyde
n-valeraldehyde
5-hydroxyvaleraldehyde
n-caproaldehyde
n-heptaldehyde and the like.

Examples of suitable aldehydes useful in preparing the second cyclic acetal group of the acid-substituted ternary acetal polymers described herein include:
2-phenyl propionaldehyde
3-phenyl butyraldehyde
benzaldehyde
2-hydroxy benzaldehyde
4-hydroxy benzaldehyde
2,4-dihydroxy benzaldehyde
cinnamaldehyde
hydrocinnamaldehyde
biphenyl carboxaldehyde
indole carboxaldehyde
salicylaldehyde
piperonal
furfural and the like.

Examples of suitable aldehydes useful in preparing the third cyclic acetal group of the acid-substituted ternary acetal polymers described herein include:
2-formyl phenoxy acetic acid
glyoxylic acid
semisuccinaldehyde
4-formyl phenoxy acetic acid
2-carboxybenzaldehyde
4-carboxybenzaldehyde
2-formyl phenoxy sulfonic acid
2-formyl phenoxy phosphonic acid and the like.

An especially preferred acid-substituted ternary acetal polymer for use in this invention comprises about 3 mole % of vinyl alcohol moieties, about 12 mole % of vinyl acetate moieties, about 48 mole % of cyclic acetal moieties derived by reaction with propionaldehyde, about 12 mole % of cyclic acetal moieties derived by reaction with 3-phenyl butyraldehyde, and about 25 mole % of cyclic acetal moieties derived by reaction with 2-formyl phenoxy acetic acid.

Another especially preferred acid-substituted ternary acetal polymer for use in this invention comprises about 7 mole % of vinyl alcohol moieties, about 12 mole % of vinyl acetate moieties, about 17 mole % of cyclic acetal moieties derived by reaction with n-butyraldehyde, about 34 mole % of cyclic acetal moieties derived by reaction with benzaldehyde and about 30 mole % of cyclic acetal moieties derived by reaction with glyoxylic acid.

Polyvinyl alcohols suitable for use as starting materials in this invention are well known commercially available materials. They preferably have an average molecular weight in the range of from about 3,000 to about 120,000. Examples of suitable polyvinyl alcohols include those available in a range of molecular weights from AIR PRODUCTS CORPORATION under the trademarks AIRVOL 203, AIRVOL 205, AIRVOL 523 and AIRVOL 540. Other suitable polyvinyl alcohols include those available from HOECHST-CELANESE under the trademarks MOWIOL 4-88, MOWIOL 5-88, MOWIOL 18-88, MOWIOL 26-88, and MOWIOL 40-88.

The novel acid-substituted ternary acetal polymers described herein can be employed with any of the diazo resins known to be useful in lithographic printing plates. These include, for example, the condensation product of p-diazo diphenyl amine and paraformaldehyde, the condensation product of 3-methoxy-4-diazo diphenylamine and paraformaldehyde, and the diazo resins of U.S. Pat. Nos. 2,063,631, 2,667,415, 2,667,498, 2,922,715, 2,946,683, 3,050,502, 3,163,633, 3,227,074, 3,311,605, 3,406,159, 3,679,419, 3,849,392 and 3,867,147.

The diazo resin is typically employed in an amount of about 20 to about 60 percent by weight of the photosensitive layer, more preferably in an amount of about 25 to about 50 percent by weight, and most preferably in an amount of about 30 to about 40 percent by weight. The acid-substituted ternary acetal polymer is typically employed in an amount of about 30 to about 80 percent by weight of the photosensitive layer, more preferably in an amount of about 40 to about 70 percent by weight, and most preferably in an amount of about 50 to about 60 percent by weight.

In addition to a diazo resin and the acid-substituted ternary acetal polymer, the imaging layer of the lithographic printing plate can optionally contain a variety of other ingredients such as colorants, stabilizers, exposure indicators and surfactants. Particularly useful colorants are pigments, including phthalocyanine, anthraquinone and quinacridone pigments. The pigment selected should be one which contains a minimal amount of heavy metal and which forms a stable dispersion with the acid-substituted ternary acetal binder resin. Useful amounts of pigment are from about 1 to about 20 percent by weight of the photosensitive layer, more preferably from about 2 to about 12 percent by weight, and most preferably from about 4 to about 8 percent by weight. Effective stabilizers include both organic and inorganic acids, preferably citric, phosphoric, ascorbic or tartaric acids. Useful amounts of acid are from about 2 to about 6 percent by weight of the photosensitive layer, more preferably from about 2.5 to about 5 percent by weight, and most preferably from about 3 to about 4 percent by weight. Useful exposure indicators are dyes which are pH sensitive and which do not couple with diazonium compounds. Examples of such dyes include eosin, azobenzene, Victoria Blue, 4-phenylazo diphenylamine, methyl violet and phenolphthalein. Useful amounts of the dye are from about 0.01 to about 3 percent by weight of the photosensitive layer, more preferably from about 0.05 to about 2 percent by weight, and most preferably from about 0.1 to about 1 percent by weight. Useful surfactants include fluorocarbon surfactants, such as FC-430 surfactant from 3M Corporation or Zonyl NS surfactant from DuPont, and silicone surfactants such as Silwet L-7606 surfactant from Union Carbide Corporation. The surfactant is used in an amount of from about 0.1 to about 4 percent by weight of the photosensitive layer, more preferably from about 0.5 to about 2.5 percent by weight, and most preferably from about 1 to about 2 percent by weight.

In forming the photosensitive layer, the diazo resin, the acid-substituted ternary acetal polymer and the optional ingredients are dispersed in a suitable solvent or mixture of solvents. Particularly useful solvents include 2-methoxyethanol and the acetate thereof, 1-methoxy-2-propanol and the acetate thereof, 2-ethoxyethanol and the acetate thereof, toluene, diisobutyl ketone, butyrolactone, methyl pyrrolidone, methyl lactate, ethyl acetate, dimethyl formamide, tetrahydrofuran, methylethyl ketone and butyl acetate.

The support for the lithographic printing plate is typically formed of aluminum which has been grained, for example by electrochemical graining, and then anodized, for example, by means of anodizing techniques employing sulfuric acid and/or phosphoric acid. Methods of both graining and anodizing are very well known in the art and need not be further described herein.

As previously indicated hereinabove, the novel acid-substituted ternary acetal polymers described herein can be employed in dual layer lithographic printing plates in which a radiation-sensitive layer comprising a photocrosslinkable polymer is coated over a radiation-sensitive layer containing a diazo resin. Photocrosslinkable polymers which are particularly useful for this purpose are those containing the photosensitive group —CH=CH—CO— as an integral part of the polymer backbone, especially the p-phenylene diacrylate polyesters. These polymers are described, for example, in U.S. Pat. Nos. 3,030,208, 3,622,320, 3,702,765 and 3,929,489. A typical example of such a photocrosslinkable polymer is the polyester prepared from diethyl p-phenylenediacrylate and 1,4-bis(β-hydroxyethoxy)cyclohexane, which is comprised of recurring units of the formula:

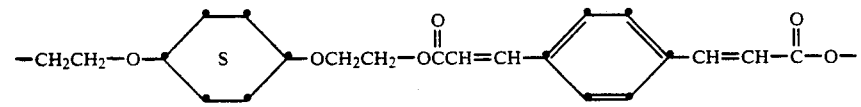

Other particularly useful polymers of this type are those which incorporate ionic moieties derived from monomers such as dimethyl-3,3'-[sodioimino)disulfonyl]dibenzoate and dimethyl-5-sodiosulfoisophthalate. Examples of such polymers include poly[1,4-cyclohexylene-bis(oxyethylene)-p-phenylenediacrylate]-co-3,3'-[sodioimino)disulfonyl]dibenzoate and poly[1,4-cyclohexylene-bis(oxyethylene)-p-phenylenediacrylate]-co-3,3'-[sodioimino)disulfonyl]-dibenzoate-co-3-hydroxyisophthalate.

The novel acid-substituted ternary acetal polymers described herein are especially useful as binder polymers that are employed in combination with diazo resins in lithographic printing plates. However, they are also useful in other applications such as solvent thickeners, films with high tensile and shear strength and films which have a low dielectric constant. They can also be used as a binder for matrices other than coatings.

The invention is further illustrated by the following examples of its practice.

EXAMPLE 1

50.0 grams of AIRVOL 205 polyvinyl alcohol (an 88% hydrolyzed polyvinyl acetate having an average molecular weight of about 25,000) were added to a closed reaction vessel fitted with a water-cooled condensing column, followed by the addition of 150 grams of demineralized water and 300 grams of n-propanol. With continual stirring, the mixture was cooked at 70° C. for 20 hours. After this time, the temperature was adjusted to 60° C. and 6.8 grams of concentrated hydrochloric acid was added. Over a 2 hour period, an admixture consisting of 15.05 grams of n-butyraldehyde and 10.76 grams of benzaldehyde was slowly and uniformly added in a dropwise manner. Upon complete addition of the mixture of aldehydes, the reaction was continued at 60° C. for an additional 2 hours, and then 9.99 grams of glyoxylic acid were added and the reaction was continued for an additional 3 hours. At this point, potassium carbonate was added until a pH of 7.0±0.5 was obtained. The neutralized reaction mixture was then added to 4.0 liters of demineralized water to precipitate the polymer product. Vigorous shear mixing was provided to form small particles as well as to remove the n-propanol and neutralization by-products. The polymer was then vacuum filtered and similarly washed two more times. After the third wash, the product was filtered and dried at 40° C. for 24 hours. 74.5 grams of polymer was obtained for a 95.8% yield. The structure of the polymer was in accordance with the structural formula provided hereinabove in which the $R_1$ group is derived from n-butyraldehyde and has the formula —$CH_2CH_2$—$CH_3$, the $R_2$ group is derived from benzaldehyde and has the formula

the $R_6$ group is derived from glyoxylic acid and has the formula —COOH, the value of $n_1$ is 7 mole %, the value of $n_2$ is 12 mole %, the value of $n_3$ is 17 mole %, the value of $n_4$ is 34 mole % and the value of $n_5$ is 30 mole %.

The acid-substituted ternary acetal polymer prepared as described above was utilized in preparing a radiation-sensitive coating composition of the following formulation:

| Component | Weight % |
|---|---|
| Acid-substituted ternary acetal polymer | 1.50 |
| Diazo resin* | 1.40 |
| Pigment (Toyo Lional Blue) | 0.15 |
| Citric acid | 0.20 |
| 2-Methoxyethanol | 76.70 |
| Demineralized water | 20.00 |
| Surfactant (ZONYL FNS) | 0.05 |
| | 100.00 |

*Condensation product of 3-methoxy-4-diazo diphenyl amine sulfate and an isomeric mixture of methoxymethyl substituted diphenyl ethers isolated as the diisopropylnaphthalene sulfonate salt.

The radiation-sensitive coating composition was filtered and coated on the surface of an aluminum support which had been electrochemically grained, anodized and conditioned with a silicate barrier layer. After drying of the radiation-sensitive layer was completed, a portion of the printing plate was overlaid with a negative test target, exposed, developed and finished in accordance with conventional practice. Using a sheet-fed press equipped with a conventional dampening system and a commercially available process black ink, the printing plate was run until image wear was observed. Solid areas became worn first, and were considered unacceptable at 305,000 impressions. The highlight dots (0.5, 1 and 2% at 150 lines/inch screen) were acceptable up to 435,000 impressions.

To further assess the durability of the printing plate, it was flood exposed and then subjected to various solvents in order to quantify chemical resistance. A rating scale of one to five was used, where one equates to essentially total removal of the coating and five equates to no coating removal and/or no coating attack.

Each of the following solvents was rubbed twenty times over a section of the plate. The plate was then rated for image attack.

methylene chloride (MCL)
methyl Cellosolve (MC)
methyl ethyl ketone (MEK)
butyrolactone (BLO)
isopropanol (IPA)
tetrahydrofuran (THF)
dimethylformamide (DMF)
toluene (T)
ethyl acetate (EA)
benzyl alcohol (BA)

The ratings for the plate described above were as follows:

| MCL - 5 | MC - 5 | MEK - 4 | BLO - 5 |
|---------|--------|---------|---------|
| IPA - 5 | THF - 5 | DMF - 5 | T - 5 |
| EA - 5 | BA - 4 | | |

The results reported above indicate that the plate performed very well for both solvent resistance and press wear. Print quality and resolution were also very good.

EXAMPLES 2-8 hyde" or as "C Aldehyde" in accordance with the following lists:

A Aldehyde 1. formaldehyde
2. acetaldehyde
3. propionaldehyde
4. n-butyraldehyde
5. isobutyraldehyde
6. n-valeraldehyde
7. n-caproaldehyde B Aldehyde 1. benzaldehyde
2. 4-hydroxy benzaldehyde
3. 2-phenyl propionaldehyde
4. 3-phenyl butyraldehyde
5. salicylaldehyde
6. 2,4-dihydroxy benzaldehyde
7. hydrocinnamaldehyde C Aldehyde 1. glyoxylic acid
2. semisuccinaldehyde
3. 2-carboxybenzaldehyde
4. 4-carboxybenzaldehyde
5. 2-formyl phenoxy acetic acid
6. 4-formyl phenoxy acetic acid In each of examples 2 to 8, the composition of the acid-substituted ternary acetal polymer is described with reference to the mole percent hydroxyl content, i.e., the mole percent of vinyl alcohol moieties, and the mole percent of moieties derived from the first, second and third aldehydes, respectively. The remainder to total 100 mole percent represents the vinyl acetate moieties.

In each of examples 2 to 8, printing plates were prepared and evaluated in the same manner as described in Example 1, and the results obtained are reported in Table II.

TABLE I

| Ex. No. | Starting PVOH | Amount (grms) | A Aldehyde | Amount (grms) | Mole % | B Aldehyde | Amount (grms) | Mole % | C Aldehyde | Amount (grms) | Mole % | Mol % Hydroxyl |
|---|---|---|---|---|---|---|---|---|---|---|---|---|
| 2 | AIRVOL 205 | 50.0 | 1 | 5.38 | 35.5 | 2 | 21.89 | 35.5 | 6 | 12.11 | 13 | 4 |
| 3 | AIRVOL 523 | 50.0 | 2 | 11.45 | 50 | 6 | 11.76 | 17 | 2 | 9.15 | 18 | 3 |
| 4 | AIRVOL 205 | 50.0 | 3 | 15.60 | 13 | 4 | 9.95 | 49 | 5 | 20.25 | 22 | 4 |
| 5 | MOWIOL 18-88 | 50.0 | 4 | 6.78 | 19 | 7 | 25.24 | 37 | 3 | 20.18 | 26 | 6 |
| 6 | AIRVOL 523 | 50.0 | 5 | 15.82 | 43 | 1 | 7.61 | 14 | 1 | 8.30 | 22 | 9 |
| 7 | MOWIOL 5-88 | 50.0 | 6 | 10.80 | 25 | 5 | 30.09 | 48 | 4 | 10.09 | 13 | 2 |
| 8 | AIRVOL 205 | 50.0 | 7 | 13.46 | 27 | 3 | 18.03 | 26 | 2 | 13.72 | 26 | 9 |

TABLE II

| Ex. No. | Number of Impressions | Dots Held (percent) | Solvent Resistance | | | | | | | | | |
|---|---|---|---|---|---|---|---|---|---|---|---|---|
| | | | MCL | MC | MEK | BLO | IPA | THF | DMF | T | EA | BA |
| 2 | 430,000 | 0.5, 1, 2 | 5 | 4 | 5 | 5 | 5 | 5 | 5 | 5 | 5 | 4 |
| 3 | 415,000 | 0.5, 1, 2 | 5 | 5 | 5 | 5 | 5 | 5 | 5 | 5 | 5 | 5 |
| 4 | 505,000 | 0.5, 1, 2 | 5 | 5 | 5 | 5 | 5 | 5 | 5 | 5 | 5 | 5 |
| 5 | 410,000 | 0.5, 1, 2 | 5 | 4 | 5 | 4 | 5 | 5 | 4 | 5 | 5 | 5 |
| 6 | 470,000 | 0.5, 1, 2 | 5 | 5 | 4 | 5 | 5 | 5 | 5 | 5 | 5 | 4 |
| 7 | 430,000 | 0.5, 1, 2 | 5 | 4 | 5 | 5 | 5 | 5 | 4 | 5 | 5 | 5 |
| 8 | 405,000 | 0.5, 1, 2 | 5 | 5 | 5 | 5 | 5 | 5 | 5 | 5 | 5 | 5 |

The procedure reported in Example 1 was repeated in each of examples 2 to 8 using the particular polyvinyl alcohols and aldehydes as indicated in Table I. (PVOH represents polyvinyl alcohol). In this table, the aldehydes are designated as "A Aldehyde" or as "B Alde- As shown by the data in Table II, in each of Examples 2 to 8, the highlight resolution was maintained throughout the run. The run length varied, but was consistently above 400,000 impressions. Differences in run length are, at least in part, attributable to variations in molecular weight. Solvent resistance was good in all cases, and the plate performed in an acceptable manner.

COMPARATIVE EXAMPLES A TO F

Acetal polymers were prepared in a similar manner to that described in Example 1, but the aldehydes selected were such that the resulting polymer was outside the scope of those defined by the structural formula presented hereinabove. The acetal polymers utilized in this invention are acid-substituted ternary acetals in which one of the acetal groups is unsubstituted or substituted with an alkyl or hydroxyalkyl group, another is substituted with an aromatic or heterocyclic moiety, and a third is substituted with an acid group, an acid-substituted alkyl group or an acid-substituted aryl group. In comparative examples A and B, the C aldehyde has been omitted and the resulting polymer is a binary acetal that lacks the $R_6$ radical. In comparative examples C and D, the B aldehyde has been omitted and the resulting polymer is a binary acetal that lacks the $R_2$ radical. In comparative examples E and F, the A aldehyde has been omitted and the resulting polymer is a binary acetal that lacks the $R_1$ radical.

The aldehydes employed in comparative examples A to F are described in Table III, and the results obtained are described in Table IV.

the composition exhibited borderline solubility in the coating solution.

COMPARATIVE EXAMPLES G TO L

Commercially available lithographic printing plates were evaluated in the same manner as described above in order to compare their performance with that of lithographic printing plates utilizing the novel acid-substituted ternary acetal resins described herein.

The printing plates evaluated were as follows:
Comparative Example G—KODAK KNA3 printing plate
Comparative Example H—POLYCHROME VISTAR M printing plate
Comparative Example I—FUJI FND printing plate
Comparative Example J—3M VIKING GM printing plate
Comparative Example K—DUPONT HOWSON AQ III printing plate
Comparative Example L—ENCO AN—61 printing plate The results obtained are reported in Table V below.

TABLE V

| Ex. No. | Number of Impressions | Dots Held (percent) | MCL | MC | MEK | BLO | IPA | THF | DMF | T | EA | BA |
|---|---|---|---|---|---|---|---|---|---|---|---|---|
| G | 260,000 | 1 & 2% | 2 | 3 | 3 | 3 | 4 | 3 | 3 | 2 | 3 | 3 |
| H | 155,000 | 2% only | 1 | 1 | 2 | 3 | 3 | 3 | 2 | 2 | 2 | 2 |
| I | 210,000 | 1 & 2% | 1 | 1 | 2 | 2 | 2 | 2 | 1 | 2 | 1 | 1 |
| J | 140,000 | 2% only | 2 | 1 | 3 | 3 | 3 | 3 | 2 | 2 | 1 | 1 |
| K | 145,000 | >5% | 1 | 1 | 1 | 2 | 3 | 2 | 1 | 2 | 1 | 1 |
| L | 225,000 | 1 & 2% | 2 | 2 | 3 | 3 | 3 | 3 | 2 | 3 | 2 | 2 |

As shown by the data in Table V, the results obtained in comparative examples G to L were greatly inferior to those obtained in the examples of the invention both in regard to run length and solvent resistance. In compari-

TABLE III

| Ex. No. | Starting PVOH | Amount (grms) | A Aldehyde | Amount (grms) | Mole % | B Aldehyde | Amount (grms) | Mole % | C Aldehyde | Amount (grms) | Mole % | Mol % Hydroxyl |
|---|---|---|---|---|---|---|---|---|---|---|---|---|
| A | AIRVOL 205 | 50.0 | 1 | 6.39 | 42 | 2 | 25.99 | 42 | — | — | — | 4 |
| B | AIRVOL 523 | 50.0 | 2 | 13.42 | 60 | 6 | 17.95 | 25 | — | — | — | 3 |
| C | AIRVOL 205 | 50.0 | 3 | 10.93 | 37 | — | — | — | 5 | 42.79 | 47 | 4 |
| D | MOWIOL 18-88 | 50.0 | 4 | 13.56 | 37 | — | — | — | 3 | 34.31 | 45 | 6 |
| E | AIRVOL 523 | 50.0 | — | — | — | 1 | 19.25 | 35 | 1 | 16.43 | 44 | 9 |
| F | MOWIOL 5-88 | 50.0 | — | — | — | 5 | 37.75 | 61 | 4 | 19.51 | 25 | 2 |

TABLE IV

| Ex. No. | Number of Impressions | Dots Held (percent) | MCL | MC | MEK | BLO | IPA | THF | DMF | T | EA | BA |
|---|---|---|---|---|---|---|---|---|---|---|---|---|
| A | 405,000 | 2% only | 4 | 3 | 4 | 4 | 4 | 5 | 4 | 4 | 4 | 4 |
| B | 395,000 | 2% only | 4 | 3 | 4 | 4 | 4 | 4 | 3 | 4 | 3 | 3 |
| C | 155,000 | 2% only | 2 | 1 | 2 | 2 | 2 | 2 | 1 | 2 | 1 | 1 |
| D | 120,000 | 2% only | 1 | 1 | 2 | 2 | 2 | 1 | 1 | 2 | 1 | 1 |
| E | 225,000 | 2% only | 1 | 1 | 2 | 2 | 2 | 2 | 1 | 2 | 1 | 1 |
| F | 195,000 | 2% only | 2 | 1 | 2 | 2 | 2 | 3 | 1 | 2 | 1 | 1 |

As shown by the data in Table IV, in comparative examples A and B, the press performance was acceptable and the solvent resistance was good. However, development was particulate and stringy, as contrasted with use of the acid-substituted ternary acetal polymers described herein, where the coating dissolves in the developing solution. In comparative examples C, D, E and F, the image lacked the toughness to resist overdevelopment, there was visible loss of image integrity and son to printing plates prepared from the novel acid-substituted ternary acetal polymers described herein, the commercially available printing plates do not run as long nor do they have equal ability to hold the highlight dots.

The invention has been described in detail, with particular reference to certain preferred embodiments thereof, but it should be understood that variations and modifications can be effected within the spirit and scope of the invention.

We claim:

1. A photosensitive composition comprising a mixture of (1) a diazo resin and (2) and acid-substituted ternary acetal polymer; said acid-substituted ternary acetal polymer having recurring units represented by the formula:

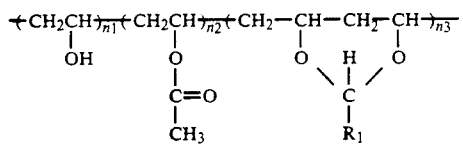

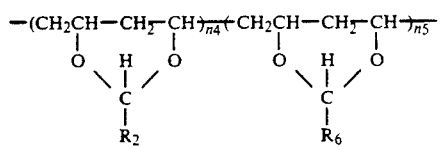

wherein $R_1$ is $-H$, $-C_nH_{2n+1}$ or $-C_2H_{2n}-OH$
where $n = 1-12$ $R_2$ is

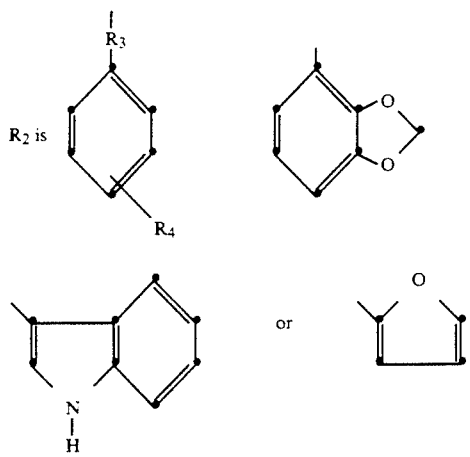

where $R_3$ is $-(CH_2)_x$ or $-(CH_2)_m CH(CH_2)_p$
$\phantom{whereR_3is-(CH_2)x-or-(CH_2)m}|$
$\phantom{whereR_3is-(CH_2)x-or-(CH_2)mCH(CH_2)}(CH_2)_y$
$\phantom{whereR_3is-(CH_2)x-or-(CH_2)mCH(CH_2)}|$
$\phantom{whereR_3is-(CH_2)x-or-(CH_2)mCH(CH_2)}CH_3$ and $x = 0-8$
$m = 0-8$
$y = 0-8$
$p = 0-8$

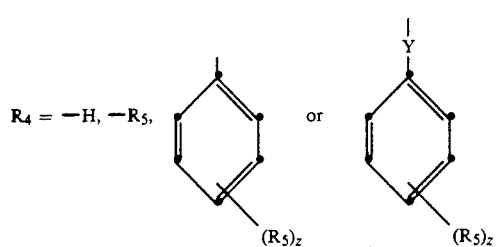

in which

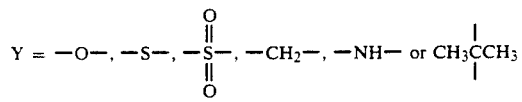

$R_5 = -OH$, $-CH_2OH$, $-OCH_3$, $-COOH$ or $-SO_3H$
$z = 1$ to 3

$R_6 = -(CH_2)_a-COOH$
$\phantom{R_6=}-(CH_2)_a-COO^\ominus M^\oplus$ or

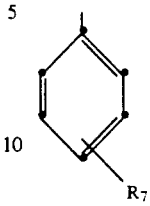

where $R_7 = -COOH$, $-COO^\ominus M^\oplus$, $-(CH_2)_aCOOH$,
$-O-(CH_2)_aCOOH$, $-SO_3H$, $-SO_3^\ominus M^\oplus$, $-PO_3H_2$,
$-PO_3^\ominus M_2^\oplus$ $-PO_4H_2$ or $-PO_4^\ominus M_2^\oplus$,
$a = 0$ to 8
$M = $ Na, K, Li or $NH_4$ and
$n_1 = 0-25$ mole %
$n_2 = 2-25$ mole %
$n_3 = 10-70$ mole %
$n_4 = 10-60$ mole %
$n_5 = 10-45$ mole %.

2. A photosensitive composition as claimed in claim 1 wherein $n_1$ is equal to 3 to 15 mole %, $n_2$ is equal to 5 to 15 mole %, $n_3$ is equal to 15 to 50 mole %, $n_4$ is equal to 12 to 45 mole % and $n_5$ is equal to 15 to 30 mole %.

3. A photosensitive composition as claimed in claim 1 wherein $R_1$ is $-H$, $-CH_2CH_3$, $-CH_2CH_2CH_3$, $-(CH_2)_3CH_3$, $\phantom{xx}CH_3$
$\phantom{xx}|$
$-CH_2-CH$ , $-(CH_2)_4CH_3$ or $-(CH_2)_6CH_3$.
$\phantom{xx}|$
$\phantom{xx}CH_3$ 4. A photosensitive composition as claimed in claim 1 wherein $R_2$ is

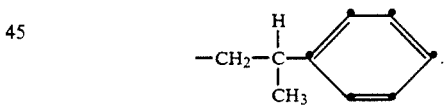

5. A photosensitive composition as claimed in claim 1 wherein $R_2$ is

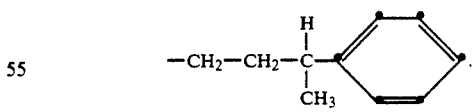

6. A photosensitive composition as claimed in claim 1 wherein $R_2$ is

7. A photosensitive composition as claimed in claim 1 wherein $R_6$ is

8. A photosensitive composition as claimed in claim 1 wherein $R_1$ is —$CH_2CH_3$ $R_2$ is

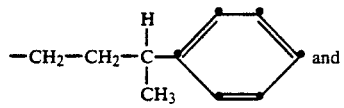

and $R_6$ is 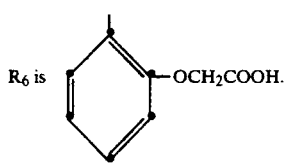

9. A photosensitive composition as claimed in claim 1 wherein said diazo resin is a condensation product of 3-methoxy-4-diazo diphenyl amine sulfate and an isomeric mixture of methoxymethyl substituted diphenyl ethers.

10. A photosensitive composition comprising a mixture of (1) a diazo resin and (2) an acid-substituted ternary acetal polymer, said acid-substituted ternary acetal polymer having recurring units represented by the formula:

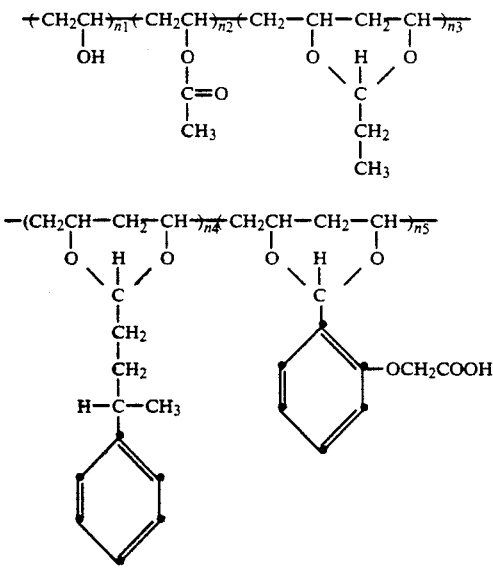

wherein $n_1$ is about 3 mole %, $n_2$ is about 12 mole %, $n_3$ is about 48 mole %, $n_4$ is about 12 mole % and $n_5$ is about 25 mole %.

11. A photosensitive composition comprising a mixture of (1) a diazo resin and (2) an acid-substituted ternary acetal polymer; said acid-substituted ternary acetal polymer having recurring units represented by the formula:

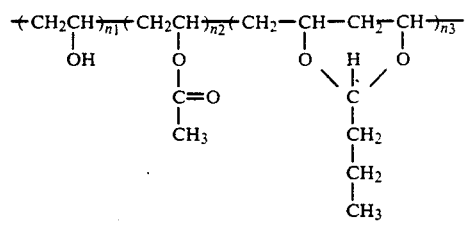

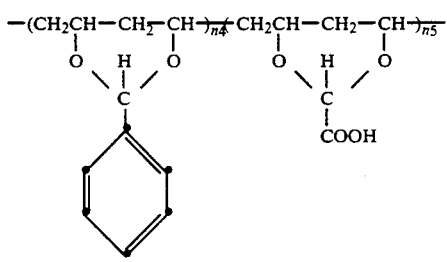

wherein $n_1$ is about 7 mole %, $n_2$ is about 12 mole %, $n_3$ is about 17 mole %, $n_4$ is about 34 mole % and $n_5$ is about 30 mole %.

12. A lithographic printing plate comprising a support having thereon a radiation-sensitive layer comprising a diazo resin and a polymeric binder, said polymeric binder being an acid-substituted ternary acetal polymer having recurring units represented by the formula:

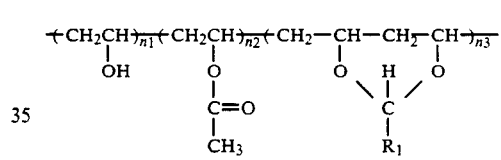

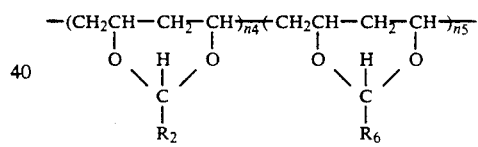

wherein $R_1$ is —H, —$C_nH_{2n+1}$ or —$C_2H_{2n}$—OH where n = 1-12

$R_2$ is 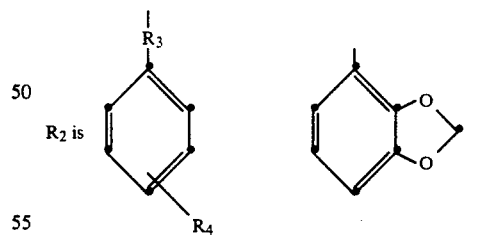

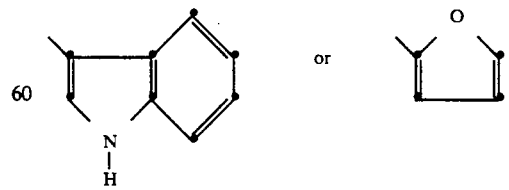

where $R_3$ is $-(CH_2)_x-$ or $-(CH_2)_m CH(CH_2)_p-$
$(CH_2)_y$
$CH_3$

-continued and x = 0-8
m = 0-8
y = 0-8
p = 0-8

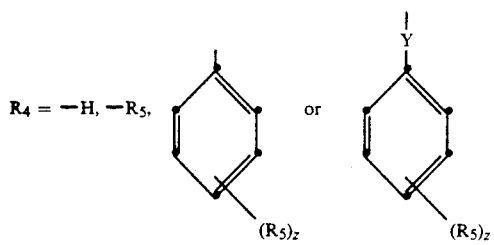

R$_4$ = —H, —R$_5$,  or in which

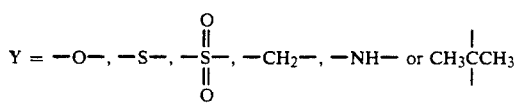

Y = —O—, —S—, —S(=O)$_2$—, —CH$_2$—, —NH— or CH$_3$C(CH$_3$)

R$_5$ = —OH, —CH$_2$OH, —OCH$_3$, —COOH or —SO$_3$H
z = 1 to 3
R$_6$ = —(CH$_2$)$_a$—COOH
—(CH$_2$)$_a$—COO$^\ominus$M$^\oplus$ or

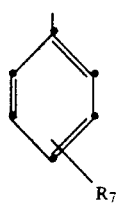

where

R$_7$ = —COOH, —COO$^\ominus$M$^\oplus$, —(CH$_2$)$_a$COOH,
—O—(CH$_2$)$_a$COOH, —SO$_3$H, —SO$_3$$^\ominus$M$^\oplus$, —PO$_3$H$_2$ or
—PO$_3$$^\ominus$M$_2$$^\oplus$ —PO$_4$H$_2$ or —PO$_4$$^\ominus$M$_2$$^\oplus$,
a = 0 to 8
M = Na, K, Li or NH$_4$ and
n$_1$ = 0–25 mole %
n$_2$ = 2–25 mole %
n$_3$ = 10–70 mole %
n$_4$ = 10–60 mole %
n$_5$ = 10–45 mole %.

13. A lithographic printing plate as claimed in claim 12 wherein n$_1$ is equal to 3 to 15 mole %, n$_2$ is equal to 5 to 15 mole %, n$_3$ is equal to 15 to 50 mole %, n$_4$ is equal to 12 to 45 mole % and n$_5$ is equal to 15 to 30 mole %.

14. A lithographic printing plate as claimed in claim 12 wherein R$_1$ is

—H, —CH$_2$CH$_3$, —CH$_2$CH$_2$CH$_3$, —(CH$_2$)$_3$CH$_3$,

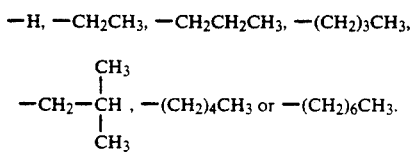

—CH$_2$—CH(CH$_3$)CH$_3$, —(CH$_2$)$_4$CH$_3$ or —(CH$_2$)$_6$CH$_3$.

15. A lithographic printing plate as claimed in claim 12 wherein R$_2$ is

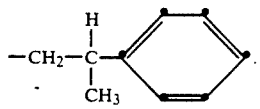

16. A lithographic printing plate as claimed in claim 12 wherein R$_2$ is

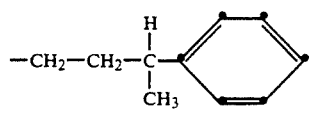

17. A lithographic printing plate as claimed in claim 12 wherein R$_2$ is

18. A lithographic printing plate as claimed in claim 12 wherein R$_6$ is

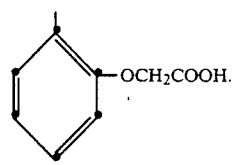

19. A lithographic printing plate as claimed in claim 12 wherein R$_1$ is —CH$_2$CH$_3$ R$_2$ is

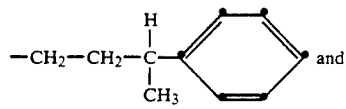 and

R$_6$ is 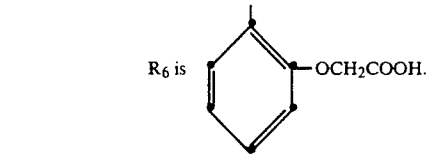

20. A lithographic printing plate as claimed in claim 12 wherein said diazo resin is a condensation product of 3-methoxy-4-diazo diphenylamine sulfate and an isomeric mixture of methoxymethyl substituted diphenyl ethers.

21. A lithographic printing plate as claimed in claim 12 wherein said support is comprised of grained and anodized aluminum.

22. A lithographic printing plate as claimed in claim 12 wherein said radiation-sensitive layer is comprised of about 25 to about 50 percent by weight of said diazo resin and about 40 to about 70 percent by weight of said acid-substituted ternary acetal polymer.

23. A lithographic printing plate as claimed in claim 12 wherein said radiation-sensitive layer additionally comprises about 2 to about 12 percent by weight of pigment, about 2.5 to about 5 percent by weight of an acid which functions as a stabilizer, about 0.05 to about 2 percent by weight of a dye which functions as an exposure indicator, and about 0.5 to about 2.5 percent by weight of a surfactant.

24. A lithographic printing plate comprising a support having thereon a radiation-sensitive layer comprising a diazo resin and a polymeric binder, said polymeric binder being an acid-substituted ternary acetal polymer having recurring units represented by the formula:

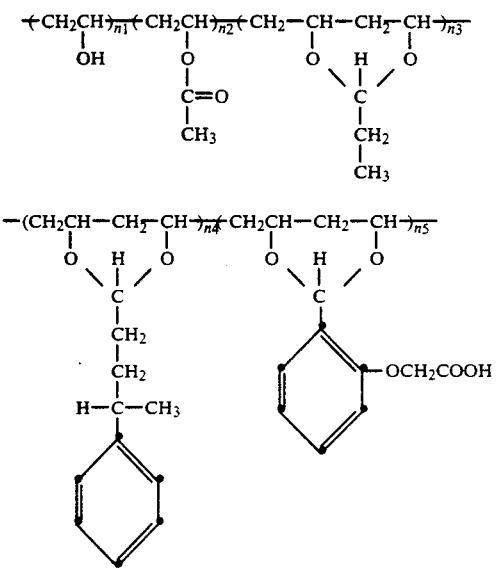

wherein $n_1$ is about 3 mole %, $n_2$ is about 12 mole %, $n_3$ is about 48 mole %, $n_4$ is about 12 mole % and $n_5$ is about 25 mole %.

25. A lithographic printing plate comprising a support having thereon a radiation-sensitive layer comprising a diazo resin and a polymeric binder; said polymeric binder being an acid-substituted ternary acetal polymer having recurring units represented by the formula:

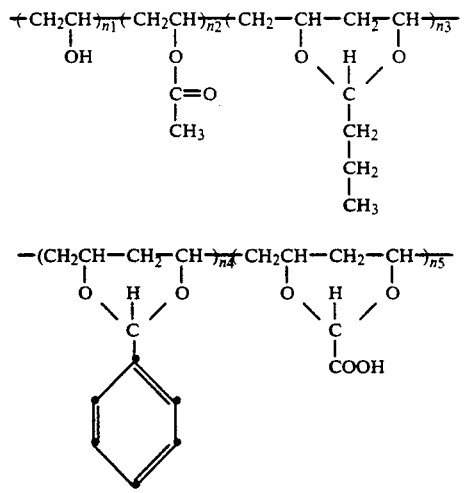

wherein $n_1$ is about 7 mole %, $n_2$ is about 12 mole %, $n_3$ is about 17 mole %, $n_4$ is about 34 mole % and $n_5$ is about 30 mole %.

26. A lithographic printing plate comprising a grained and anodized aluminum support having thereon a first radiation-sensitive layer comprising a diazo resin and a polymeric binder and a second radiation-sensitive layer thereon said first radiation-sensitive layer comprising a photocrosslinkable polymer; said polymeric binder being an acid-substituted ternary acetal polymer having recurring units represented by the formula:

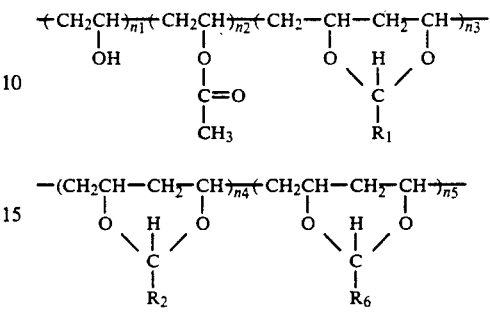

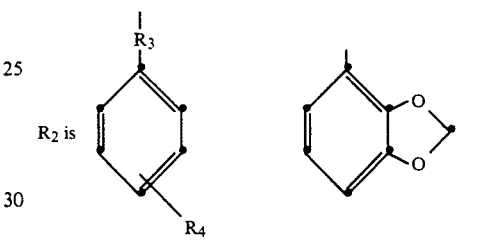

wherein $R_1$ is $-H$, $-C_nH_{2n+1}$ or $-C_2H_{2n}-OH$ where n = 1-12

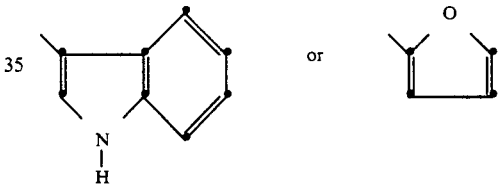

where $R_3$ is $-(CH_2)_x$ or $-(CH_2)_m CH(CH_2)_p$
$\phantom{where R_3 is -(CH_2)_x or -(CH_2)_m}(CH_2)_y$
$\phantom{where R_3 is -(CH_2)_x or -(CH_2)_m(CH_2)}CH_3$ and x = 0-8
m = 0-8
y = 0-8
p = 0-8

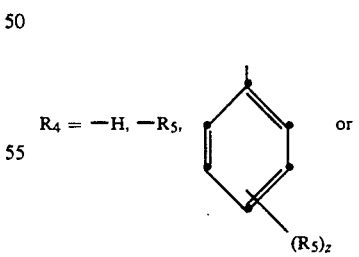

in which $Y = -O-, -S-, -\overset{\overset{O}{\|}}{\underset{\|}{S}}-, -CH_2-, -NH-$ or $CH_3\overset{|}{\underset{|}{C}}CH_3$ $R_5 = -OH, -CH_2OH, -OCH_3, -COOH$ or $-SO_3H$
z = 1 to 3
$R_6 = -(CH_2)_a-COOH$ $-(CH_2)_a-COO^{\ominus}M^{\oplus}$ or
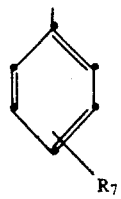
where
$R_7 = -COOH, -COO^{\ominus}M^{\oplus}, -(CH_2)_aCOOH,$
$-O-(CH_2)_aCOOH, -SO_3H, -SO_3^{\ominus}M^{\oplus}, -PO_3H_2,$
$-PO_3^{\ominus}M_2^{\oplus} -PO_4H_2$ or $-PO_4^{\ominus}M_2^{\oplus},$
a = 0 to 8
M = Na, K, Li or $NH_4$
and
$n_1$ = 0–25 mole %
$n_2$ = 2–25 mole %
$n_3$ = 10–70 mole %
$n_4$ = 10–60 mole %
$n_5$ = 10–45 mole %.
* * * * *